United States Patent
Kister et al.

(10) Patent No.: US 7,064,564 B2
(45) Date of Patent: Jun. 20, 2006

(54) BUNDLED PROBE APPARATUS FOR MULTIPLE TERMINAL CONTACTING

(75) Inventors: January Kister, Redwood City, CA (US); Krzysztof Dabrowiecki, Fremont, CA (US)

(73) Assignee: Antares conTech, Inc., Gilbert, AZ (US)

( * ) Notice: Subject to any disclaimer, the term of this patent is extended or adjusted under 35 U.S.C. 154(b) by 25 days.

(21) Appl. No.: 09/775,676

(22) Filed: Feb. 1, 2001

(65) Prior Publication Data

US 2002/0101248 A1    Aug. 1, 2002

(51) Int. Cl.
*G01R 27/08* (2006.01)

(52) U.S. Cl. ........................ 324/715; 324/713
(58) Field of Classification Search ................ 324/761, 324/537, 759, 760, 754, 713, 525, 696, 697
See application file for complete search history.

(56) References Cited

U.S. PATENT DOCUMENTS

| | | | | |
|---|---|---|---|---|
| 4,027,935 A | * | 6/1977 | Byrnes et al. | 439/289 |
| 4,423,373 A | * | 12/1983 | LeCroy, Jr. | 324/72.5 |
| 4,491,797 A | * | 1/1985 | Velsher | 324/421 |
| 4,565,966 A | * | 1/1986 | Burr et al. | 324/519 |
| 4,667,149 A | * | 5/1987 | Cohen et al. | 324/715 |
| 5,136,252 A | * | 8/1992 | Witt | 324/715 |
| 5,491,424 A | * | 2/1996 | Asar et al. | 324/525 |
| 5,565,788 A | * | 10/1996 | Burr et al. | 324/762 |
| 5,999,002 A | * | 12/1999 | Fasnacht et al. | 324/419 |
| 6,051,982 A | * | 4/2000 | Alcoe et al. | 324/754 |
| 6,181,144 B1 | * | 1/2001 | Hembree et al. | 324/537 |
| 6,218,846 B1 | * | 4/2001 | Ludwig et al. | 324/713 |
| 6,218,848 B1 | * | 4/2001 | Hembree et al. | 324/754 |
| 6,263,294 B1 | * | 7/2001 | Frederickson et al. | 324/527 |
| 6,275,052 B1 | * | 8/2001 | Hembree et al. | 324/754 |
| 6,320,403 B1 | * | 11/2001 | Shabde et al. | 324/762 |
| 6,384,614 B1 | * | 5/2002 | Hager et al. | 324/754 |
| 6,384,714 B1 | * | 5/2002 | Thompson et al. | 340/146.2 |
| 6,400,168 B1 | * | 6/2002 | Matsunaga et al. | 324/754 |
| 6,404,213 B1 | * | 6/2002 | Noda | 324/754 |
| 6,791,344 B1 | * | 9/2004 | Cook et al. | 324/754 |

* cited by examiner

*Primary Examiner*—Diane Lee
*Assistant Examiner*—John Teresinski

(57) ABSTRACT

A probe apparatus having probe groups comprising two or three probes that independently contact single terminals of tested chips. As a result, the probe apparatus is capable of recognizing voltage drops of a test signal applied prior to the chip testing onto a test path along two or three probes contacting, the terminal and the interfaces between them. The test path does not pass through the chip. An electronic circuit measures the voltage drops and compensated accordingly operational signals passing through the terminals, the probes and the interfaces during the chip testing. A first embodiment comprises two probes per group. A second embodiment comprises three probes per group. In the second embodiment, the variable resistance component of three resistance measurements of first/second, first/third and second/third resistance paths are compared by the electronic circuit, in order to determine absolute resistance values for each of the three signal paths. Consequently, in the second embodiment, the voltage drops may be individually adjusted for each of the three operational signal paths.

17 Claims, 8 Drawing Sheets

BUNDLED PROBE APPARATUS FOR MULTIPLE TERMINAL CONTACTING

FIELD OF INVENTION

The invention relates to probe apparatus for testing electronic circuit chips. Particularly, the present invention relates to a probe apparatus capable of recognizing and compensating resistance discrepancies in contact interfaces between chip terminals and probe tips.

BACKGROUND OF INVENTION

Before electronic circuit chips are packaged, they are conventionally tested to retrieve information about their performance levels. A performance criterion, for example, are voltage level discrepancies within the tested chip. The continuing development of circuit chips results in an ever decreasing voltage level at which the circuit chips operate and have to be tested. The recognition of voltage level discrepancies at ever decreasing operational voltage levels requires more precise inducing and deriving of test signals during the chip testing. For a cost effective chip fabrication it is at the same time desirable to have a probe apparatus capable of compensating for a broader bandwidth of physical and dimensional tolerances of the chip terminals accessed during the chip testing. On the other hand, the chip testing has to be performed with shortest possible testing times, leaving little time for establishing sufficient contacting quality between the probes and the chip terminals.

The contacting quality is mainly defined by a resistance in an interface between probe tip and chip terminal. To reduce the interface resistance, probes and/or the probe apparatus are commonly configured to scrub slightly along the terminal surface and thereby remove thin insulating oxidation layers. With decreasing sizes of the chip terminals and decreasing terminal surface radii in case of solder bumps or solder balls, scrubbing distances may become shorter. As a result, the removal of oxide layers becomes more difficult to accomplish.

Therefore, there exists a need for a probe apparatus capable of recognizing resistance discrepancies in the probe/terminal interfaces and for correspondingly adjusting a voltage level of a consecutive operational signal applied onto or derived from the chip terminal during the actual chip testing. The present invention addresses this need.

SUMMARY

A probe apparatus is introduced that provides two or more probes grouped together in order to contact single chip terminals. After bringing the grouped probes into contact with the single chip terminal, the resistance is recognized along the probes, the chip terminal and their interfaces. The grouped probes have a configuration and are assembled in a fashion that prevents them from directly conductively contacting with each other.

The recognized resistance is taken as a factor to compensate for a voltage drop of an operational signal applied onto or derived from the single terminal during the following testing of the circuit chip.

In a first embodiment, two probes are grouped or bundled and are brought into conductive contact with a single chip terminal. The initially recognized resistance is averaged between the two probes and half of the recognized resistance is considered for the voltage drop compensation. One or both probes may be utilized for applying and/or deriving operational signals during the chip testing.

In a second embodiment, three probes are brought into conductive contact with a single chip terminal. In a following procedure three path resistances are recognized; a first path resistance along first and second probe, the chip terminal and their interfaces; a second path resistance along first and third probe, the chip terminal and their interfaces; a third path resistance along second and third probe along the chip terminal. All three path resistances have a constant resistance portion and a variable resistance portion. The constant resistance portion is predetermined by the physical configuration of the probes and the test terminal. The variable resistance portion results from the configuration of the interface between the probe tips contacting or scrubbing the single terminal as is well known to those skilled in the art. The variable resistance portion changes with each new contacting. The probes themselves may be in a loose contact with terminals of a space transformer as is well known to those skilled in the art. In such a case, the variable resistance portion may include an additional interface resistance in the interface between the upper probe ends and the corresponding terminals of the space transformer.

After recognizing the three path resistances, their constant resistance portion is subtracted and the remaining variable resistance portions of the first, second and third path resistance are compared to each other. Each variable path resistance has two variable path resistance components, each correlated to one of the two interfaces along the test path. The test path is the path of a test voltage applied between the space transformer terminals in order to recognize the three path resistances. The test voltage passes only through the chip terminal and not through the tested circuit chip itself. The test voltage is utilized for testing path resistances, whereas the operational signal is applied and/or derived from the chip terminal and passes through the chip during the chip testing.

In the second embodiment the three variable path resistance components are recognized preferably for each contacted chip terminal after the three unit probes are brought into contact. The three variable path resistance components form an interweaved relation in three unique combinations of two of them, one unique combination in each of the three path resistances. This interweaved relation is utilized to derive an absolute resistance for each variable path resistance component and consequently an absolute resistance for a first, second and/or third operational signal path through the first, second and/or third probe onto or away from the chip terminal. As a result, each of the three probes may be utilized for chip testing regardless their eventual diverging variable path resistance components.

The probes are preferably buckling beams as are well known to those skilled in the art. Grouped probes dedicated for concurrent contacting of single chip terminals and in the configuration of buckling beams may be bundled and guided in correspondingly shaped sheath holes. In the first embodiment, the sheath holes may have a long hole shape configured to slide able hold two probes in position suitable for contacting the chip terminals. In the second embodiment, the sheath hole may have a circular shape.

Grouped probes may be held together over their length either in parallel orientation to each other or may be curled around each other for additional mechanical strength.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

Figure 1:
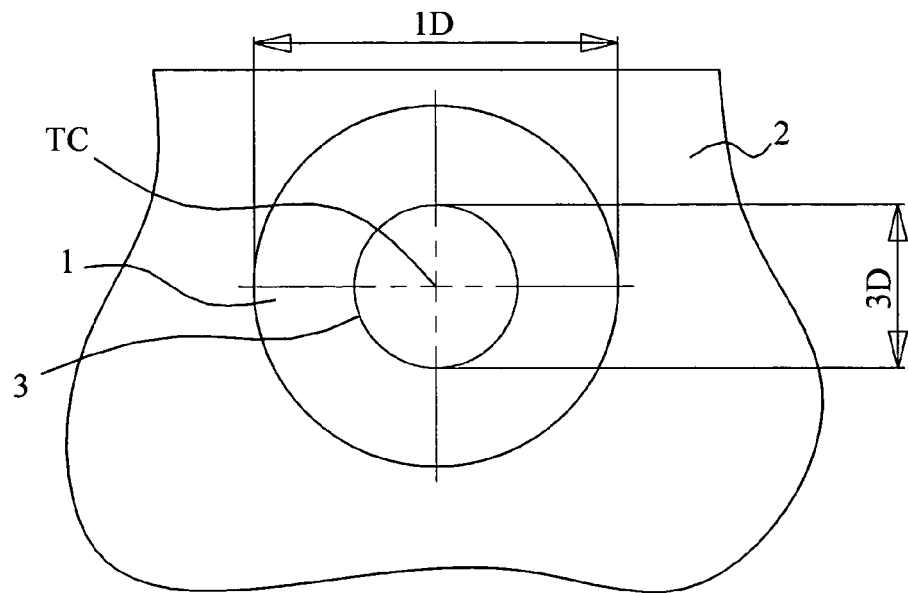
FIG. 1 shows a top view of an exemplary chip terminal placed on a chip segment.

FIG. 1 shows a top view of a terminal 1 placed on a chip segment 2. The chip segment 2 represents electronic circuit chips as are well known to those skilled in the art. For the purpose of simplicity, the chip segment 2 is illustrated having only one terminal 1. It is clear, that a chip represented by the chip segment 2 may have any number of terminals in multiple representation of the terminal 1.

The terminal 1 has an exemplary configuration of a solder bump as they are known to those skilled in the art. The solder bump has a terminal height 1H (see FIG. 5) and a terminal surface radius 1R (see FIG. 5). It is noted that the core of the invention is not limited by the shape or configuration of the terminal 1. Moreover, the terminal 1 may have any shape or configuration suitable for being contacted by two or more probe tips 27A, 27B (see FIGS. 5 and 6) like, for example, flat terminals or solder balls.

The terminal 1 has a terminal diameter 1D within which a probe target area 3 having the probe target diameter 3D is shown. The terminal 1 may be a rotationally symmetric terminal like for instance a solder ball or solder bump as are well known to those skilled in the art. In that case, the terminal center TC may be a rotational axis of the non-planar structure of the terminal 1. It is noted that the scope of the invention is not limited to any specific shape of configuration of the terminal 1, which may be planar as well.

The probe target area 3 is the area wherein a conventional probe tip (not shown) is brought into contact with its center during the testing of the chip. The probe target diameter 3D is defined in correspondence with the terminal diameter 1D to reassure reliable contact of probe tips 27A, 27B (see FIGS. 5, 6) and the terminal 1. Positioning tolerances of the tested chip and assembly tolerances of the probe tips 27A, 27B within the probe apparatus are adjusted to the probe target diameter 3D. The smaller the probe target diameter 3D relative to the terminal diameter 1D, the more continuous a probe tip contacting quality between the probe tips 27A, 27B and the terminal 1. Scrubbing of the probe tip 27A, 27B may be performed within the probe target area 3.

Figure 2:
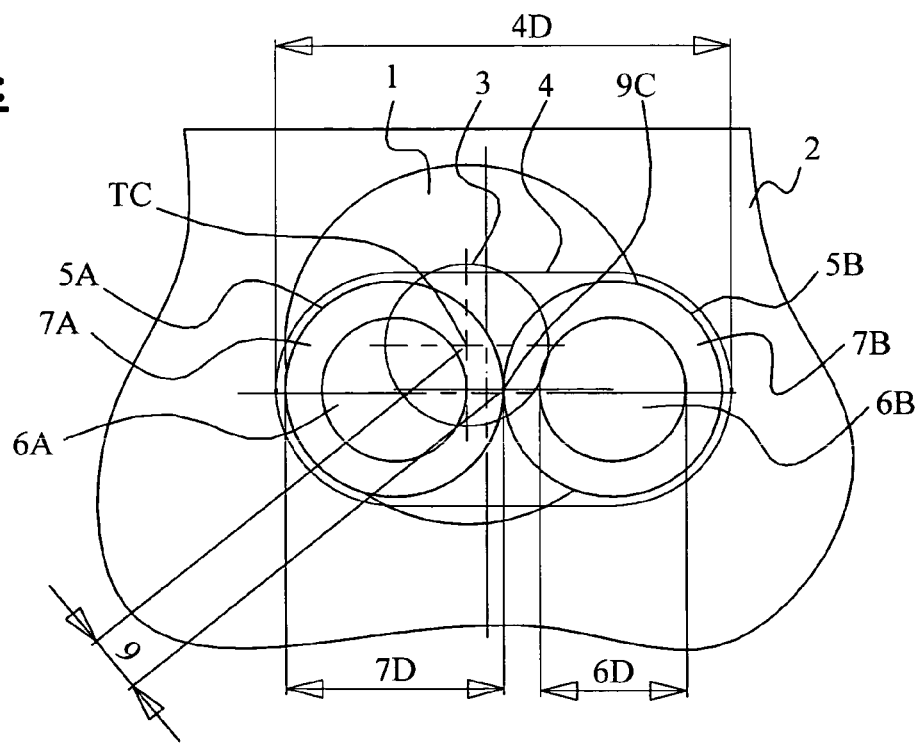
FIG. 2 shows a top view of the chip terminal of FIG. 1 contacted by two exemplary probe segments according to the first embodiment of the present invention.

FIG. 2 shows a top view of the terminal 1 being contacted by first and second probes 5A, 5B according to the first embodiment of the invention. First and second probes 5A, 5B have a common contacting center 9C, which is shown in a position within the probe target area 3. For the sole purpose of general understanding, the common contacting center 9C is shown in an offset distance 9 relative to the terminal center TC, which is also the center of the probe target area 3. It is clear that the common contacting center 9C may be positioned at any location within the probe target area 3 during a real life testing.

First and second probes 5A, 5B are exemplarily shown as being essentially cylindrical and protruding in view direction. The first and second probes 5A, 5B represent in a simplified form buckling beam probes as are well known to those skilled in the art. It is noted that the scope of the invention is not limited to buckling beam probes having circular section shapes in their portions dedicated for contacting chip terminals. Moreover, the present invention extends to any probes having tips in a configuration that allows them to be contacted with a single chip terminal in a number of two or more. Never the less, buckling beams are the preferred selection for the individual probes 5A, 5B and 5C (see FIGS. 4, 5, 6).

In FIG. 2, the probes 5A, 5B are shown with conductive cores 6A, 6B, and the insulation layers 7A, 7B. The conductive cores 6A, 6B have a core diameter 6D. The insulation layers 7A, 7B define the probe segment diameter 7D. The probes 5A, 5B are guided within a guiding boundary 4, which may be provided by a sheath as is well known to those skilled in the art. The guiding boundary has a maximum extension 4D, which is less than the probe target diameter 3D plus half of an array distance of multiple representations of the terminal 1 arrayed on the chip represented by the chip segment 2.

The insulation layers 7A, 7B are configured to prevent the conductive cores 6A, 6B from conductively contacting with each other.

Figure 3:
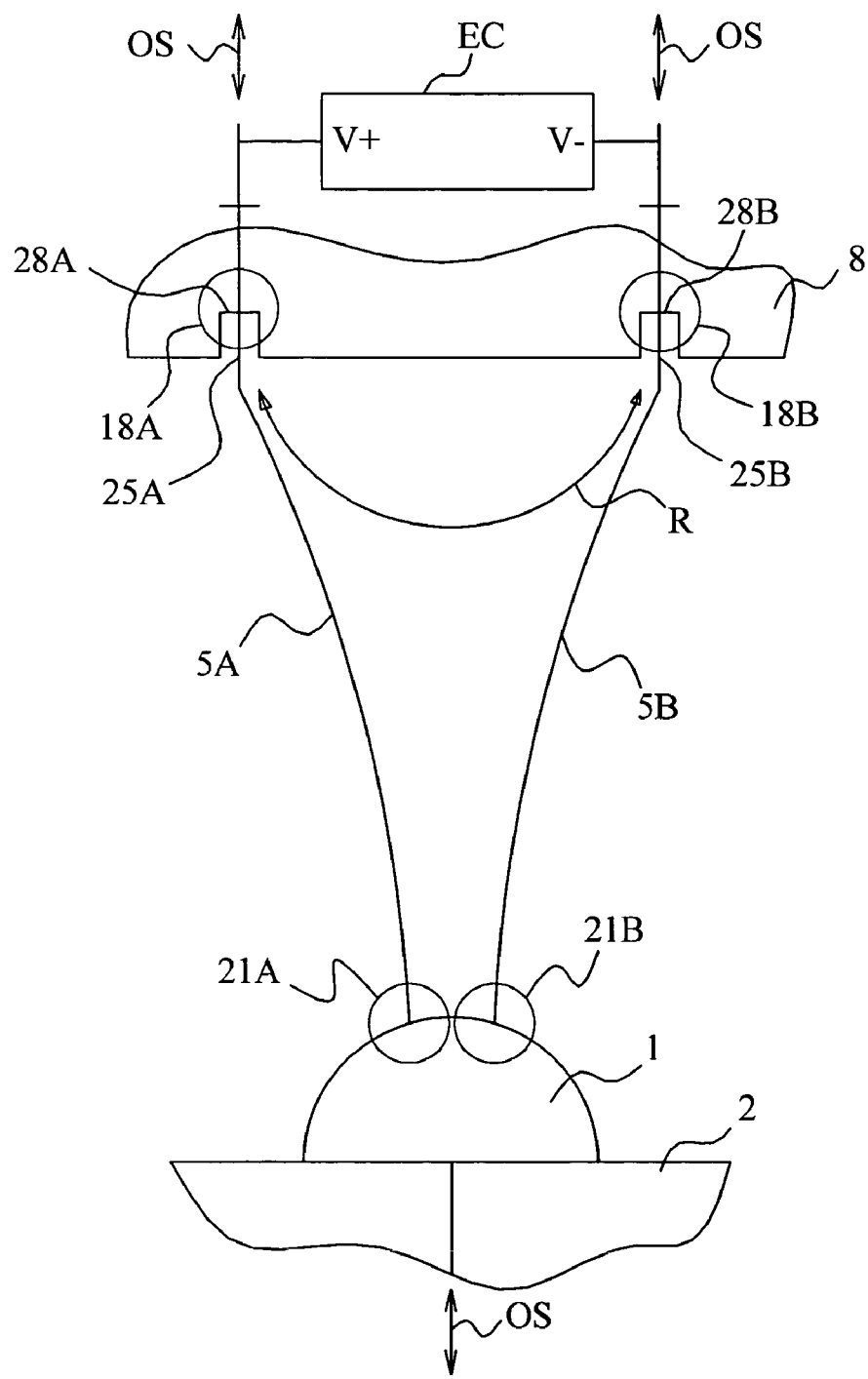
FIG. 3 shows a schematic view of two probes contacting a single terminal and having a test voltage applied.

FIG. 3 shows a schematic front view of the probes 5A, 5B contacting the terminal 1 and space transformer terminals 28A, 28B of a space transformer 8. The contacting of two individual probes 5A, 5B with the single terminal 1 provides a test path between the terminals 28A, 28B that does not pass through the tested chips circuitry. An electronic circuit EC may apply a test voltage V+ and V− on the terminals 28A, 28B and a path resistance R between the terminals 28A, 28B is measured without affecting the circuit chip. The probes 5A, 5B and the terminal 1 define a constant resistance portion of the path resistance. The interfaces 21A, 21B between the probes 5A, 5B and the terminal 1 define a variable resistance portion of the path resistance. In the case where the two probes are in a loose contact with the terminals 28A, 28B, the variable resistance portion may be additionally defined by the interfaces 18A, 18B between the upper probe ends 25A, 25B and the terminals 28A, 28B. The loose contact of the probe ends 25A, 25B with the terminals 28A, 28B may be a force induced contact established by the contact force induced by the terminal 1 onto the probe tips 27A, 27B and opposed by the terminals 28A, 28B. The loose contact may also be a friction based contact provided by a spring loaded fit of the upper probe ends 25A, 25B within correspondingly caved terminals 18A, 18B. During the circuit chip testing, the operational signals OS are passing through the space transformer 8, the probes 5A, 5B, the terminal 1, the interfaces 18A, 18B, 21A, 21B and the chip represented by the chip segment 2.

After measuring the path resistance, the probe apparatus may begin testing the circuit chip by transmitting and/or receiving operational signals via the probes 5A and/or 5B onto and/or away from the terminal 1. The voltage levels of the operational signals are increased in correspondence to the half path resistance in order to compensate for a voltage drop of them along one of the probes 5A, 5B, the terminal 1, one of the interfaces 21A, 21B and eventually one of the interfaces 18A, 18B. The operational signals may be directed through one or both probes 5A, 5B.

The measurement of the path resistance along the test path and the voltage level adjustment of the operational signals may be provided by electronic circuitry as is well known to those skilled in the art. This electronic circuitry may be part of the space transformer, or at any other location within the probe apparatus. It is noted that the core of the invention is not limited to a specific location or configuration of the electronic circuitry. Moreover, the electronic circuitry may be part of a separate apparatus operating in combination with the probe apparatus of the present invention.

The recognized path resistance may be further utilized to control other factors related to the testing and/or fabrication of the circuit chips tested by the inventive apparatus. For example, continuously and evenly changing path resistance of all accessed terminals of a number of tested chips may be utilized as an indicator to adjust production settings related to the fabrication of the tested chips' terminals.

The recognized path resistance may also be utilized to derive information about the working condition of the probe apparatus itself. For example, discrepancies of several path resistances between individual probe groups may be used as indicator for deformations of probe tips or other developing functional distortions of the grouped probes. Path resistance discrepancies may also be utilized as indicator for necessary probe tip cleaning operation.

Figure 4:
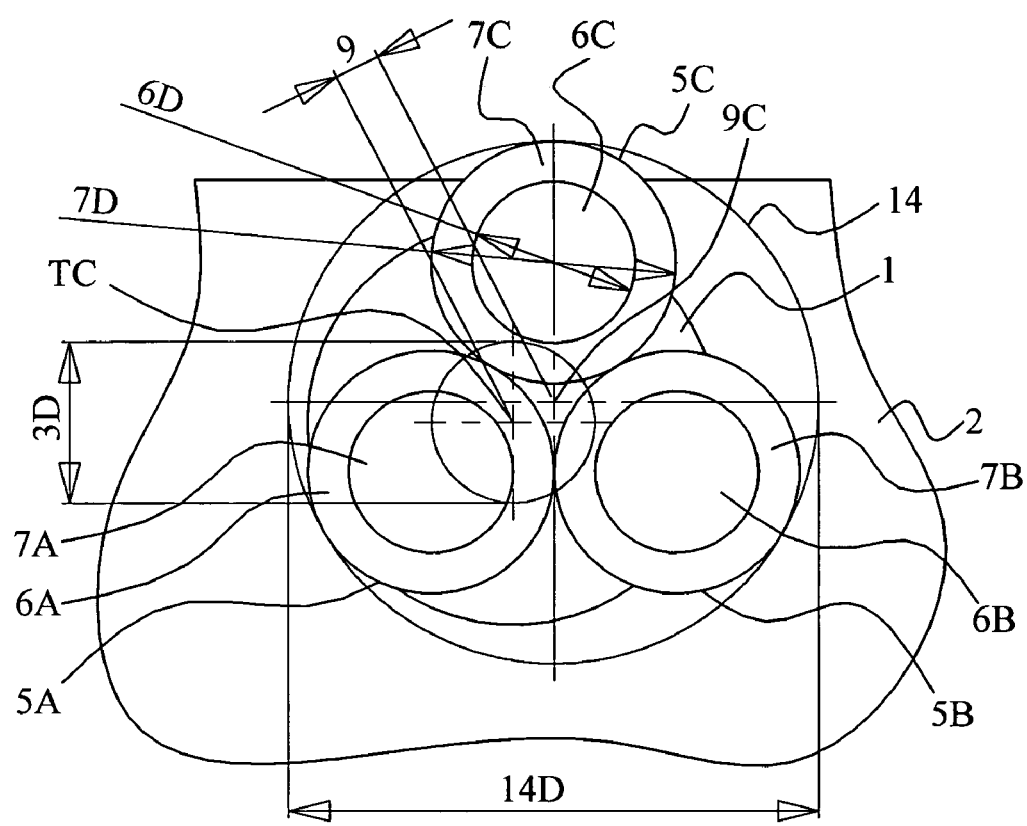
FIG. 4 shows a top view of the chip terminal of FIG. 1 contacted by three exemplary probe segments according to the second embodiment of the present invention.

FIG. 4 shows a top view of a second embodiment of the invention in which three probes 5A, 5B, 5C are combined in a probe group dedicated for contacting the single terminal 1. The third probe 5C preferably conforms in its configuration to the first and second probes 5A, 5B.

The teachings stated for the first embodiment may be applied to the second embodiment with following differences:
1. The presence of three probes 5A, 5B, 5C provides for three individual path resistances rather than only one path resistance as described for the first embodiment. A first path resistance is provided along first and second probe 5A, 5B, the terminal 1 and the corresponding interfaces. A second path resistance is provided along first and third probe 5A, 5C, the terminal 1 and the corresponding interfaces. A third path resistance is provided along second and third probe 5B, 5C, the terminal 1 and the corresponding interfaces. The three path resistances have a constant resistance portion and a variable resistance portion as described for the first embodiment.
2. The guiding boundary 14 may be circular in shape rather than a long hole as described for the guiding boundary 4.

Figure 5:
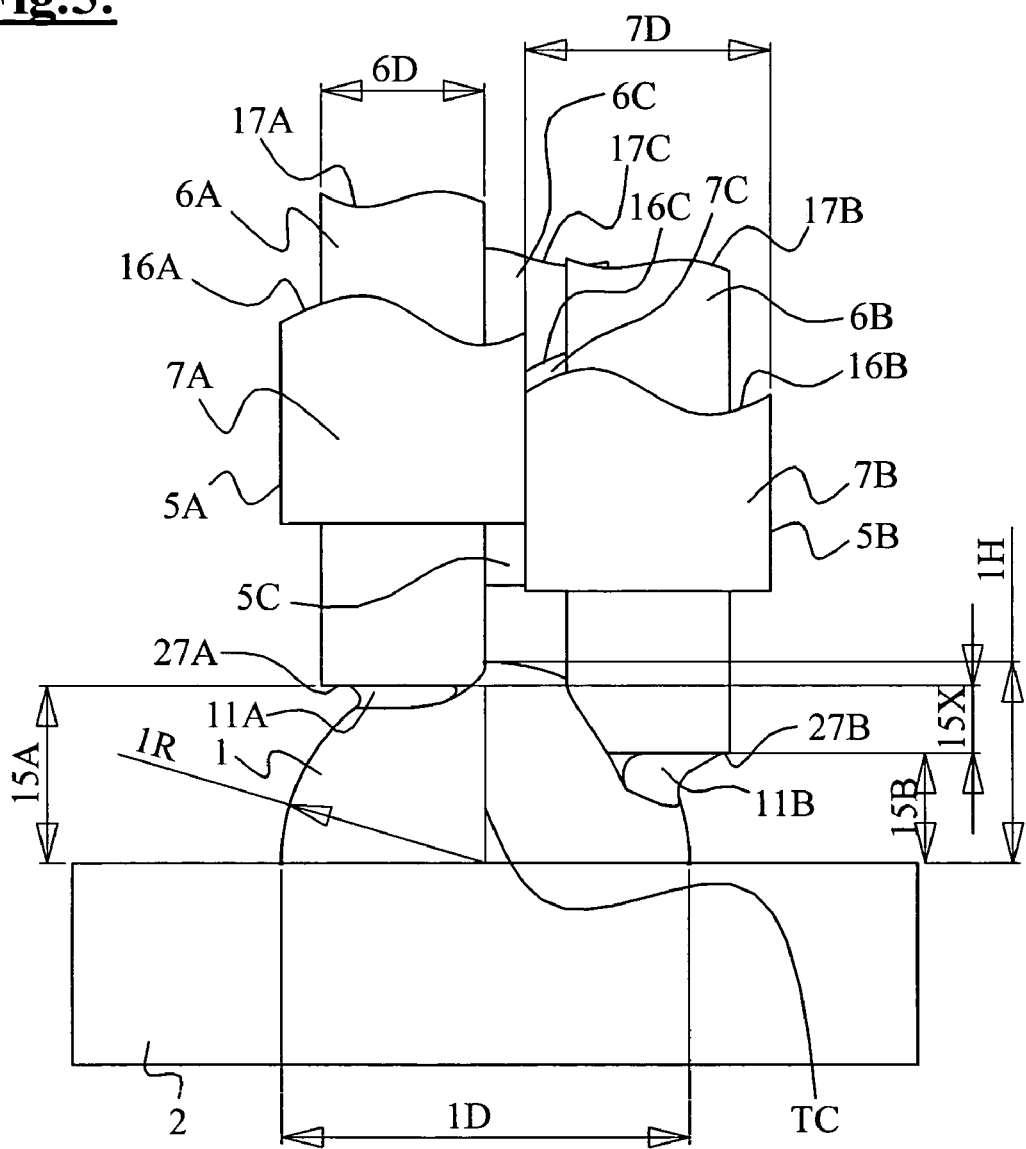
FIG. 5 shows a front view of the chip terminal of FIG. 1 contacted by three exemplary probe segments according to FIG. 3.

FIG. 5 shows a front view of the second embodiment. For the purpose of simplicity, the probes 5A, 5B, 5C are shown with their conductive cores 6A, 6B, 6C being broken off along the breaking lines 17A, 17B, 17C and the insulation layers 7A, 7B, 7C are broken off along the breaking lines 16A, 16B, 16C. The probe tips 27A, 27B are illustrated as they are impacting the terminal 1 due to a contact force with which the terminal 1 is pressed against them during the chip testing. The probe 5C may also deform with its probe tip the terminal 1, which is not visible in FIG. 5 (and FIG. 6) since the probe 5C is positioned behind the terminal contour having the radius 1R and the height 1H. The impacting of the probes 5A, 5B, 5C results in plastic deformations 11A, 11B, 11C (see FIG. 7).

The offset distance 9 results in differing impacting levels 15A, 15B of the probes 5A, 5B, 5C. The impacting level of the probe 5C is again not shown because of the reason described above. The probes 5A, 5B, 5C are configured to allow sufficient suspension within the probe group in order to compensate for the differences of the impacting levels 15A, 15B.

Figure 6:
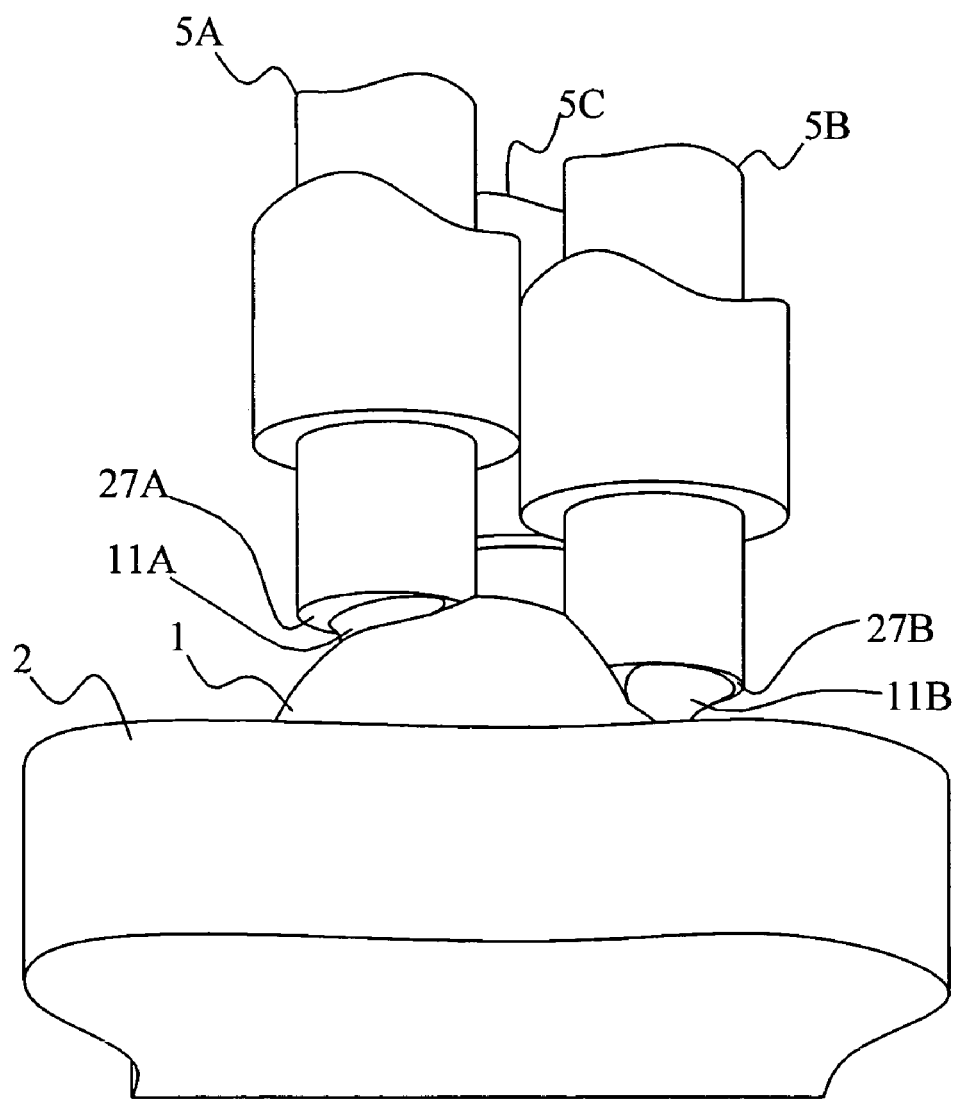
FIG. 6 shows a three-dimensional view of the chip terminal of FIG. 1 contacted by three exemplary probe segments according to FIG. 3.

FIG. 6 shows a three-dimensional view from a low frontal viewpoint onto the three probes 5A, 5B, 5C impacting the terminal 1. FIG. 6 illustrates more clearly the plastic deformations 11A, 11B, resulting from the scrubbing of the probes 5A, 5B. The probes 5A, 5B, 5C are exemplarily illustrated in the FIGS. 5 and 6 with laterally exposed conductive cores 6A, 6B, 6C in proximity to the probe tips 27A, 27B. The core of the invention is not limited by a specific configuration of the probes 5A, 5B, 5C. It is clear that the conductive cores 6A, 6B, 6C may be insulated to the very tip of the probes 5A, 5B, 5C or may have any other configuration suitable for multiple contacting of single chip terminals. For example, the probe tips 27A, 27B and the probe tip of the probe 5C may have a spherical shape rather than a cylindrical. The probe tips 27A, 27B may be spherically formed by a short melting of them as is well known for the fabrication of contact pins. Spherically formed probe tips may provide a self centering effect on the probe group having three probes 5A, 5B, 5C. As a result, lateral forces resulting from the offset distance 9 on the terminal 1 may be kept to a minimum.

Figure 7:
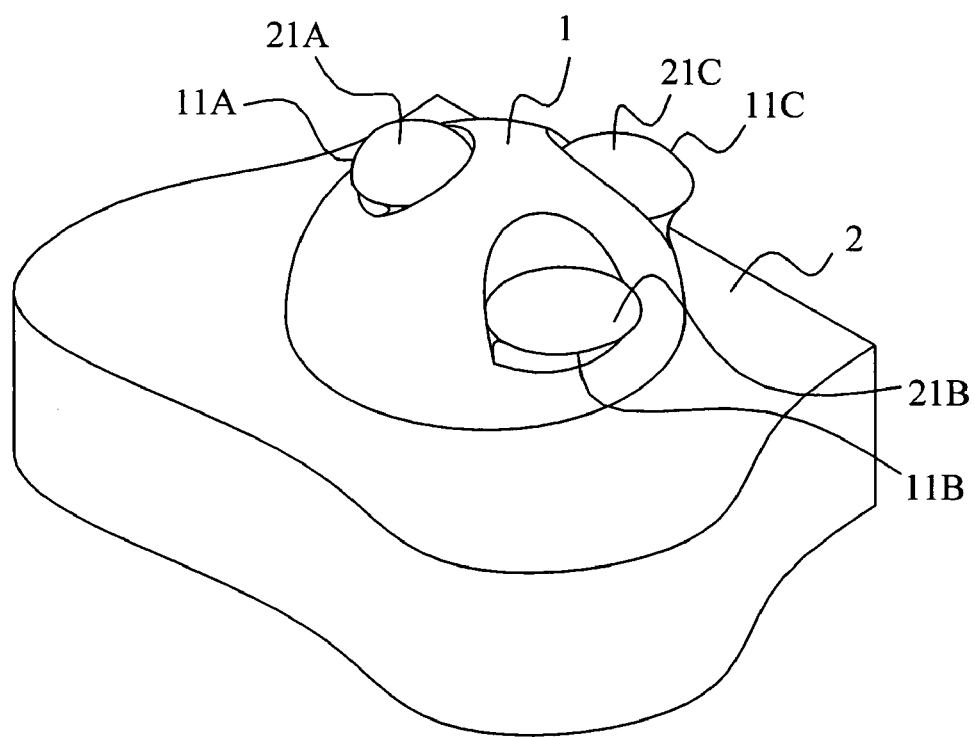
FIG. 7 shows a three-dimensional view of the chip terminal of FIG. 1 with plastic deformations resulting from a contacting by three exemplary probe segments according to FIG. 3.

FIG. 7 shows a three dimensional view of the terminal 1 with the plastic deformations 11A, 11B, 11C. The probes 5A, 5B, 5C are hidden in order to illustrate the interfaces 21A, 21B, 21C between the terminal 1 and the probes 5A, 5B, 5C. The interfaces 21A, 21B, 21C may impose varying interface resistances between the probe tips 27A, 27B of the probes 5A, 5B, 5C and the terminal 1. The varying interface resistances may result from remaining oxide layers, which may not be fully removed by the probe tips' scrubbing as is well known to those skilled in the art.

In addition, the use of more than one, preferably more than two probes contacting the terminal 1 results in balanced lateral forces stemming from eventual off center contacting of the non planar terminal surface. In cases where a probe apparatus has to simultaneously contact and test a high number of terminals 1, sum lateral forces are kept at a low level. In addition, the probe tips may have a spherical shape, which may increase a self centering effect of each probe group contacting single terminals.

Figure 8:
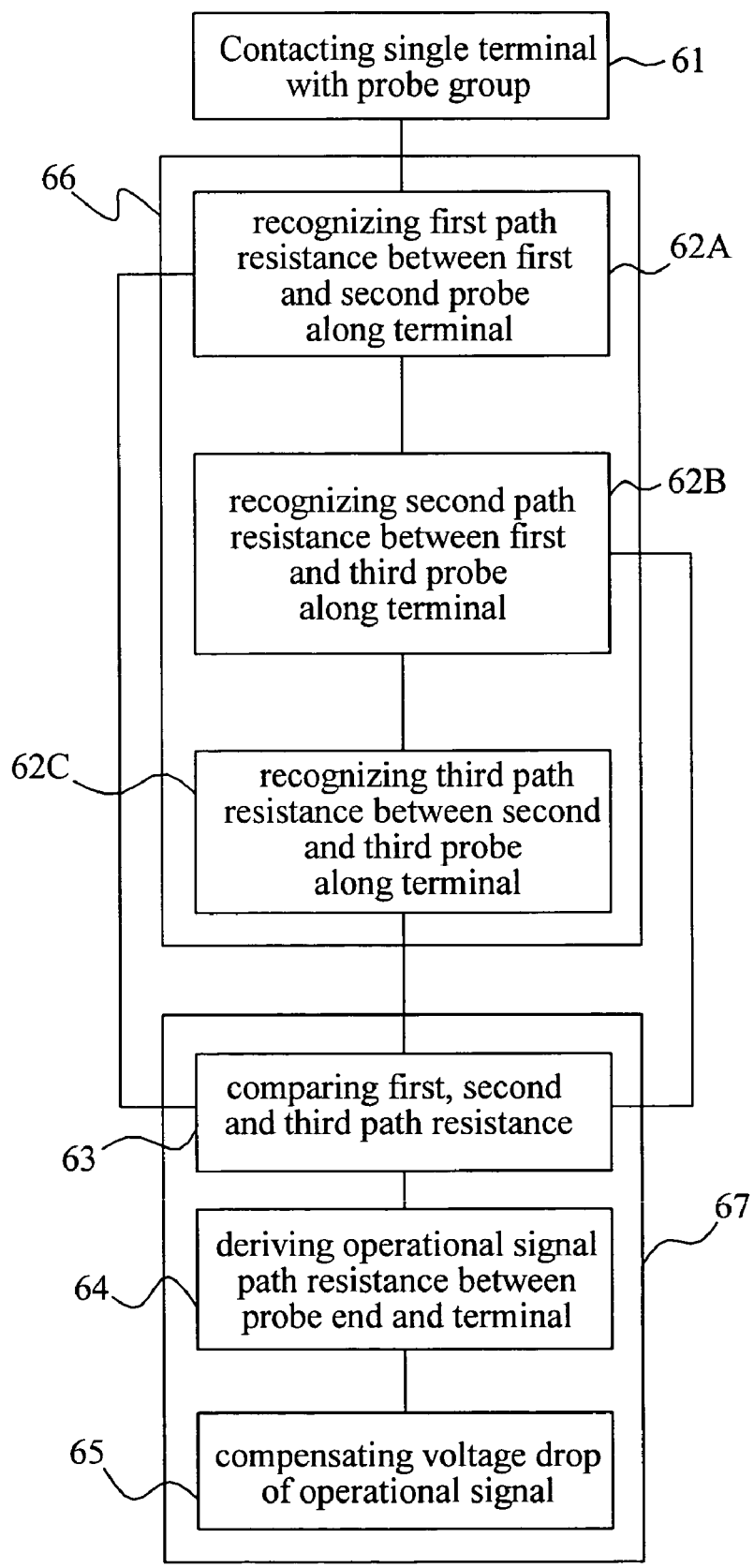
FIG. 8 shows a block diagram illustrating the steps corresponding to the second embodiment of the invention.

FIG. 8 shows a block diagram illustrating the steps corresponding to the second embodiment of the present invention. During a chip testing cycle, a number of chip terminals may be contacted by probe groups as shown by the step 61. In the following steps 62A, 62B, 62C, the first second and third path resistance are recognized by a resistance recognition means illustrated by the block 66. In the following step 63, first second and third path resistance are compared with each other. In a next step 64, an absolute resistance values for the operational signal paths are derived from the step 63, which is described below under FIG. 9 in more detail. In a final step 65, the voltage levels of the operational signals may be adjusted as is described for the first embodiment. The testing signals may be directed in fractions through one, two or all three operational signal paths corresponding to the probes 5A, 5B, 5C. The voltage levels may be individually adjusted for one, two or all operational signal paths.

Figure 9:
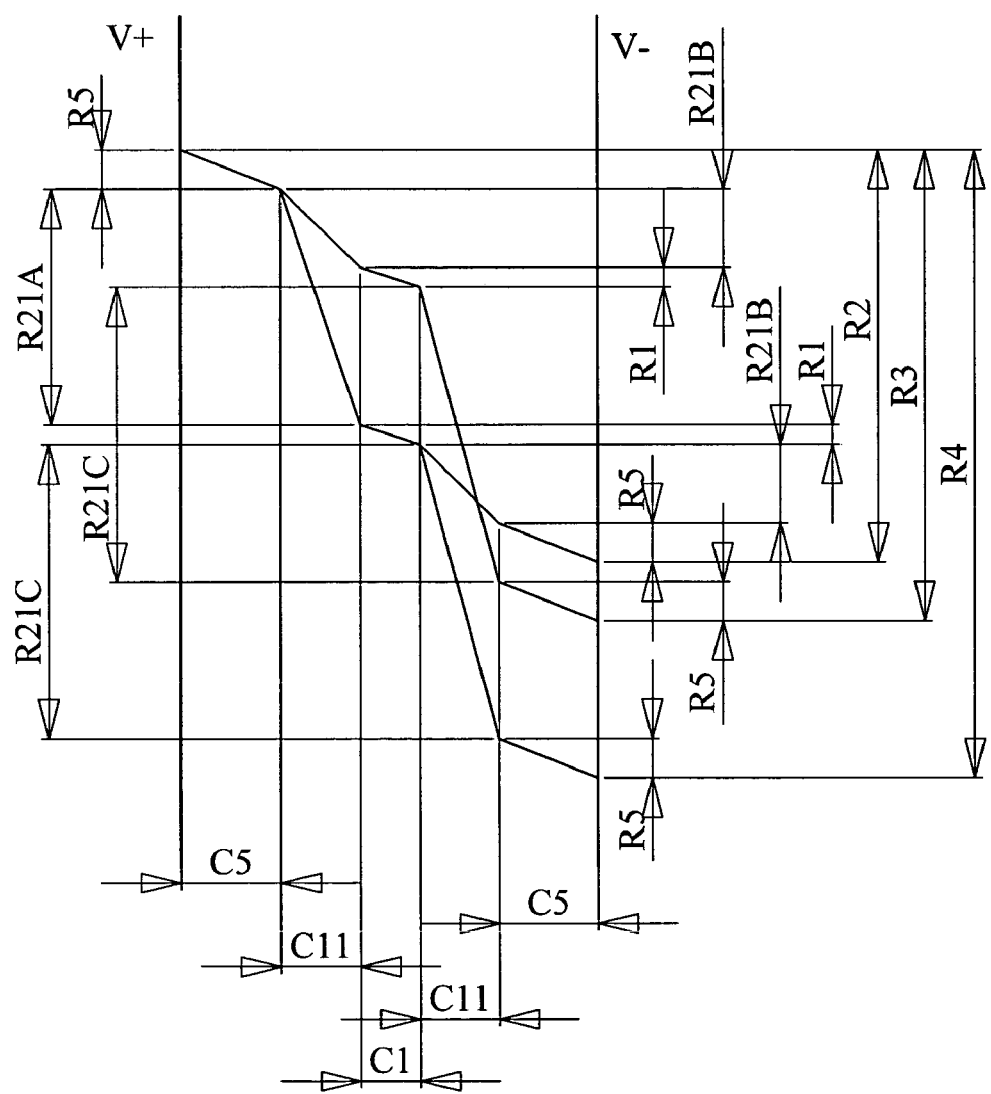
FIG. 9 shows a simplified graph of constant and variable voltage drops according to first, second, and third path resistance measured by applying a test voltage.

FIG. 9 shows a simplified graph of voltage drops along the first, second and third test paths during the measurement of the first, second and third path resistances.

Illustrated are graph segments C1, C5 representing the constant resistive elements terminal 1 and probes 5A, 5B, 5C. Illustrated are also the graph segments C11 representing the variable resistance elements, which are the interfaces 21A, 21B, 21C and eventual the interfaces 18A, 18B and a corresponding interface between the probe 5C and a terminal of the space transformer 8.

The terminal 1 is illustrated with an exemplary voltage drop R1. The first, second and third probes 5A, 5B, 5C are illustrated with an exemplary voltage drop R5. The first, second and third interfaces 21A, 21B, 21C and eventual the interfaces 18A, 18B and a corresponding interface for the probe 5C are illustrated with exemplary voltage drops R21A, R21B, R21C. Consequently, the first, second and third path resistances result in the first, second and third test voltage drops R2, R3, R4 along their test paths.

The test voltage drops R2, R3, R4 are associated with ohm's resistances. The resistances of the probes 5A, 5B, 5C as well as the resistance of the terminal 1 are predetermined and constant. The constant resistances are therefore subtracted from the three path resistances. The remaining three variable resistance portions of the three path resistances are compared with each other. Following relation between the test voltage drops are defined:

$$R21A + R21C + R1 + 2*R5 = R4$$

$$R21B + R21C + R1 + 2*R5 = R3$$

$$R21A + R21B + R1 + 2*R5 = R2$$

From this follows:

$$R21A = R4 - R1 - 2*R5 - R21C$$

$$R21C = R3 - R1 - 2*R5 - R21B$$

$$R21B = R2 - R1 - 2*R5 - R21A$$

This allows the following substitutions, which result in absolute values of the individual variable resistance portions derived solely from the constant resistance portions R1, R5 and the three path resistances R2, R3, R4.

$$R21C = R3 - R2 + R21A$$

$$R21A = (R4 - R1 - 2*R5 - R3 + R2)/2$$

The equations are only shown for an absolute value of R21A. It is clear to one skilled in the art how to derive absolute values for R21B and R21C from the equations above. An algorithm according to the equations above may be implemented in the electronic circuit as is well known to those skilled in the art in order to derive absolute values for each operational signal path resistance associated to each of the three probes 5A, 5B, 5C.

Further more, the core of the invention may be applied to any apparatus having probes contacting terminals for transferring electrical signals.

It is noted, that the scope of the invention is not limited to a specific number of probes contacting single terminals. The invention may be utilized to provide, for example, four probes for testing contact resistance of a single terminal in accordance with 4-Wire Ohm's Measurement as is well known to those skilled in the art.

Accordingly, the scope of the present invention described in the specification above, is set forth by the following claims and their legal equivalent:

What is claimed is:

1. A method of compensating for a voltage drop of an operational signal passing through an operational signal path, said method comprising the steps of:

contacting a single terminal of an integrated circuit device with a probe group comprising two or more probes;

determining a plurality of path resistances along respective pairs of said two or more probes of said probe group, said single terminal and respective interfaces between said probes and said single terminal;

deriving an operational signal path resistance based on said plurality of path resistances, the deriving step including (a) identifying a constant portion of each of the path resistances and a variable portion of each of the path resistances, and (b) comparing the variable portion of each of the path resistances with one another to derive the operational signal path resistance; and compensating for said voltage drop in correspondence to said derived operational signal path resistance.

2. The method of claim 1, wherein said contacting step is provided by said probe group including a first, a second and a third of said probes, wherein said determining step includes determining a first, a second and a third path resistance corresponding to conductive paths including said first, said second and said third of said probes, and wherein said deriving includes deriving an absolute value of a first, a second and a third variable portion or each of said first path resistance, said second path resistance and said third path resistance.

3. The method of claim 1 wherein the contacting step includes contacting the single terminal with the two or more probes such that the probes are electrically isolated from one another.

4. The method of claim 1 wherein the contacting step includes contacting the single terminal with the two or more probes such that a substantially spherically shaped tip of each of the probes contacts the single terminal.

5. The method of claim 4 further comprising the step of self centering the probe group on the single terminal at least partially via the substantially spherically shaped tips.

6. The method of claim 4 wherein the contacting step includes substantially concurrently contacting the single terminal with each of the two or more probes.

7. The method of claim 1 further comprising the step of establishing a force induced contact between (1) an end of each of the two or more probes opposite the single terminal, and (2) a terminal of a system configured to provide a voltage signal to the two or more probes.

8. The method of claim 1 further comprising the step of establishing a friction based contact between (1) an end of each of the two or more probes opposite the single terminal, and (2) a terminal of a system configured to provide a voltage signal to the two or more probes.

9. The method of claim 1 wherein the deriving step includes identifying the constant portion to include a resistance of (1) each of the two or more probes, and (2) the single terminal.

10. The method of claim 1 wherein the deriving step includes identifying the variable portion to include a resistance of an interface between (1) each of the two or more probes, and (2) the single terminal.

11. The method of claim 10 wherein the deriving step includes identifying the variable portion to also include a resistance of another interface between (1) each of the two or more probes, and (2) a terminal of a system configured to provide a voltage signal to the two or more probes.

12. The method of claim 1 wherein the compensating step includes increasing an applied voltage to at least a portion of the two or more probes.

13. The method of claim 1 wherein the contacting step includes contacting the single terminal with the probe group consisting of two probes.

14. The method of claim 1 wherein the contacting step includes contacting the single terminal with the probe group consisting of three probes.

15. The method of claim 1 wherein the contacting step includes contacting the single terminal with the probe group consisting of three probes, and wherein the determining step includes (1) determining a first path resistance along a first and a second of the three probes, (2) determining a second path resistance along the first and a third of the three probes, and (3) determining a third path resistance along of the second and a third of the three probes.

16. The method of claim 1 wherein the contacting step includes contacting the single terminal with the probe group consisting of four probes.

17. The method of claim 1 wherein the contacting step includes contacting the single terminal with the probe group consisting of four probes, and wherein the determining step includes utilizing a 4-Wire Ohm's Measurement to determine at least a portion of each of the plurality of path resistances.

* * * * *